(12) United States Patent
Park et al.

(10) Patent No.: US 7,388,223 B2
(45) Date of Patent: *Jun. 17, 2008

(54) FLAT PANEL DISPLAY DEVICE AND METHOD OF FABRICATING THE SAME

(75) Inventors: Jin-Woo Park, Yongin (KR); Ho-Kyoon Chung, Yongin (KR)

(73) Assignee: Samsung SDI Co., Ltd., Suwon-si (KR)

( * ) Notice: Subject to any disclaimer, the term of this patent is extended or adjusted under 35 U.S.C. 154(b) by 60 days.

This patent is subject to a terminal disclaimer.

(21) Appl. No.: 11/365,498

(22) Filed: Mar. 2, 2006

(65) Prior Publication Data

US 2006/0145150 A1  Jul. 6, 2006

Related U.S. Application Data

(63) Continuation of application No. 10/796,980, filed on Mar. 11, 2004, now Pat. No. 7,038,236.

(30) Foreign Application Priority Data

May 28, 2003 (KR) ............................. 2003-34181

(51) Int. Cl.
*H01L 35/24* (2006.01)
(52) U.S. Cl. .................... 257/40; 257/59; 257/72; 257/103; 257/99; 257/E51.019
(58) Field of Classification Search ............ 257/40
See application file for complete search history.

(56) References Cited

U.S. PATENT DOCUMENTS 5,246,879 A * 9/1993 Hsu et al. ............... 438/386

(Continued)

FOREIGN PATENT DOCUMENTS

JP  4-230997  8/1992

(Continued)

OTHER PUBLICATIONS

Office Action issued by the Japanese Patent Office in Japanese Patent Application No. 2004-145436 on Mar. 6, 2007.

(Continued)

*Primary Examiner*—Tu-Tu Ho
(74) *Attorney, Agent, or Firm*—Stein, McEwen & Bui, LLP (57) ABSTRACT

An organic light emitting device, and a method of fabricating the same, has a cathode electrode that can prevent oxygen or moisture from infiltrating. The organic light emitting device of the present invention has a lower electrode, an organic thin film layer and an upper electrode successively formed on the substrate. The upper electrode has at least two-layered thin films having different grain density and grain size. A lower film of the at least two-layered thin films of the upper electrode has a first Al thin film having a lower grain density and larger grain size than an upper of the at least two-layered thin films. The upper film has a second Al thin film having relatively higher grain density and smaller grain size than the first Al thin film.

14 Claims, 4 Drawing Sheets

U.S. PATENT DOCUMENTS

| | | | |
|---|---|---|---|
| 5,364,654 | A | 11/1994 | Hosokawa et al. |
| 6,402,579 | B1 | 6/2002 | Pichler et al. |
| 7,038,236 | B2 * | 5/2006 | Park et al. .................. 257/40 |
| 2002/0008815 | A1 | 1/2002 | Hanakawa et al. |
| 2002/0027414 | A1 | 3/2002 | Sekiya et al. |
| 2004/0178082 | A1 * | 9/2004 | McDaniel et al. ........ 205/785.5 |
| 2005/0003231 | A1 | 1/2005 | Suzuki et al. |

FOREIGN PATENT DOCUMENTS

| | | |
|---|---|---|
| JP | 04-334895 | 11/1992 |
| JP | 7-235281 | 9/1995 |
| JP | 9-22782 | 1/1997 |
| JP | 409022782 A * | 1/1997 |
| JP | 3-187193 | 8/1997 |
| JP | 11-67461 | 3/1999 |
| JP | 11-162652 | 6/1999 |

OTHER PUBLICATIONS

Office Action issued in Japanese Patent Application No. 2004-145436 in Japanese Patent Office on Jul. 27, 2006.

U.S. Appl. No. 10/796,980, filed Mar. 11, 2004, Jin-Woo Park et al., Samsung SDI Co., Ltd.

Office Action issued on Sep. 4, 2007 by the Japanese Patent Office for Japanese Patent Application No. 2004-145436.

Klauk et al. "Ion-beam-deposited ultrathin transparent metal contacts" Thin Solid Films 366, 2000, pp. 272-278.

* cited by examiner

FLAT PANEL DISPLAY DEVICE AND METHOD OF FABRICATING THE SAME

CROSS-REFERENCE TO RELATED APPLICATIONS

This application is a continuation of U.S. patent application ser. No. 10/796,980, filed Mar. 11, 2004, now U.S. Pat. No. 7,038,236, which claims the benefit of Korean Patent Application No. 2003-34181, filed May 28, 2003 in the Korean Intellectual Property Office, the disclosures of which are hereby incorporated herein by reference in its entirety.

BACKGROUND OF THE INVENTION

1. Field of the Invention

The present invention relates to flat panel display devices and, more particularly, to organic light emitting devices and methods of fabricating the same having cathode electrodes to prevent oxygen and/or moisture from infiltrating.

2. Description of the Related Art

An organic light emitting device is a flat panel display device that is an emissive display device in which an organic compound is electrically excited to emit light. The organic compound has characteristics such as a low driving voltage and a thin type. Moreover, since the organic light emitting device has features such as a wide viewing angle, quick response time, and the like, which are required in a liquid crystal display that is a flat panel display device, the organic light emitting device has attracted attention as a next generation display device.

For the organic light emitting device, a problem has arisen as to a life span of a device depending on a passivation method. To solve this problem, Japanese patent publication No. 4-334895, for example, discloses a dual passivation method for a long life span of the display device.

Figure 1:
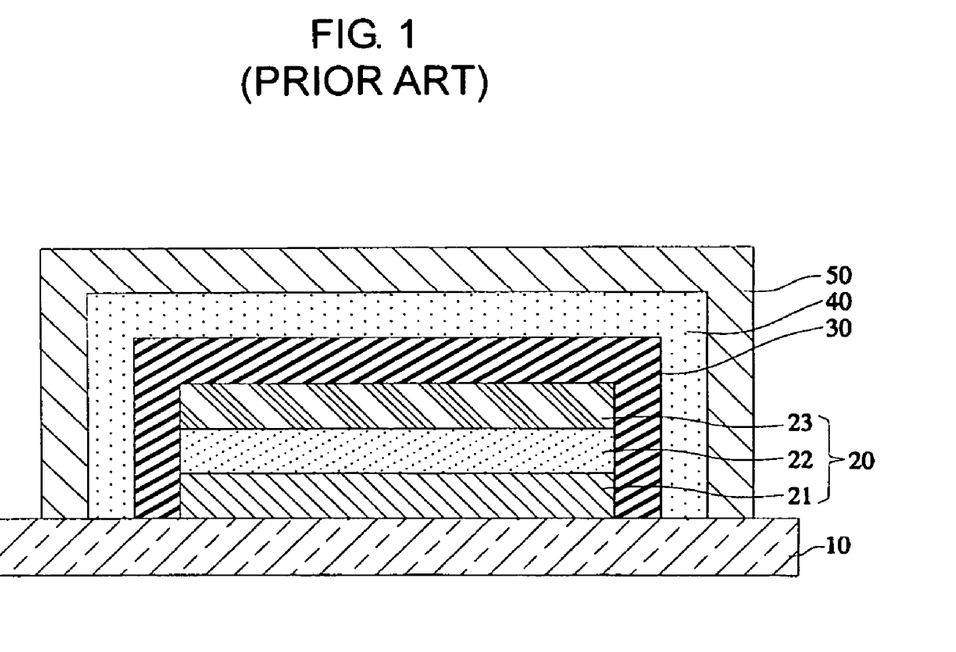
FIG. 1 is a cross-sectional view of a conventional organic light emitting device.

FIG. 1 shows a cross-sectional structure of a flat panel display device made with the conventional dual passivation method. Referring to FIG. 1, in the conventional organic light emitting device, an organic light emitting (hereinafter, referred to as "organic EL") element 20 has an anode electrode 21, an organic thin film layer 22, and a cathode electrode 23, which are laminated on a glass substrate 10. An inorganic encapsulating layer 30 is formed to cover the organic EL element 20, and the organic EL element 20 and the inorganic encapsulating layer 30 are encapsulated with an encapsulating substrate 50. Here, the encapsulating substrate 50 encapsulates by using an adhesive resin layer 40 such as a light-curing adhesive with a low moisture absorption property in order to prevent moisture infiltration.

The conventional display device used the inorganic encapsulating layer 30 to passivate the organic EL element 20. The inorganic encapsulating layer 30 was formed by using a Chemical Vapor Deposition (CVD) method or a Physical Vapor Deposition (PVD) method, where an organic thin film that is an underlying layer is susceptible to heat and mechanical stresses. As such, the inorganic encapsulating layer 30 does not have a good film quality. Moreover, the inorganic encapsulating layer 30 has a porous structural property so that the inorganic encapsulating layer 30 is susceptible to moisture infiltration. Thus, a perfect passivation could not be performed. Therefore, in the conventional art, the life span of the device cannot be guaranteed only with the inorganic encapsulating layer 30, so that there was a problem that a second passivation must be performed with the adhesive resin and the encapsulating substrate.

SUMMARY OF THE INVENTION

An aspect of the present invention provides a flat panel display device and a method of fabricating the same having a cathode electrode with a function of a passivation layer, by forming an aluminum film with a dense thin film structure.

It is another aspect of the present invention to provide a flat panel display device and a method of fabricating the same that can extend a life span.

Additional aspects and/or advantages of the invention will be set forth in part in the description which follows and, in part, will be obvious from the description, or may be learned by practice of the invention.

To achieve the above and/or other aspects of the invention, an embodiment of the present invention provides an organic light emitting device comprising a lower electrode, an organic thin film layer, and an upper electrode successively formed on a substrate, wherein the upper electrode includes at least two-layered thin films, and each of the two films have a different corresponding grain density.

According to an aspect of the present invention, an organic light emitting device includes a lower electrode, an organic thin film layer, and an upper electrode successively formed on a substrate, wherein the upper electrode includes at least two-layered thin films, and each of the two films has a corresponding different grain size.

According to an aspect of the present invention, an organic light emitting device includes a light emitting device including a lower electrode, at least one organic thin film layer and an upper electrode successively formed on a substrate, wherein the upper electrode has a conductive material that has an increasing grain density and decreasing grain size as a function of distance from the substrate, the conductive material serving as an electrode for applying a predetermined voltage to the organic thin film layer and a passivation layer that prevents moisture and/or oxygen from infiltrating into the organic thin film layer.

According to an aspect of the present invention, a method of fabricating an organic light emitting device includes forming a lower electrode on an insulating substrate; forming an organic thin film layer on the lower electrode; and forming an upper electrode by successively forming at least two-layered thin films, where each of the two films has a different corresponding grain density on the organic thin film layer.

According to an aspect of the present invention, one of the thin films, which has a highest grain density or a smallest grain size of the two thin films, is formed as the most upper layer furthest from the substrate and acts as a passivation layer that prevents moisture and/or oxygen from infiltrating.

According to an aspect of the invention, the at least two-layered thin films constituting the upper electrode has a boundary surface between thin films due to differences in grain density or a grain size, or does not have a boundary surface between the thin films by gradual changes of the grain density or the grain size.

According to an aspect of the present invention, the at least two-layered thin films constituting the upper electrode have the same material, wherein the lower film of the at least two-layered thin films has a first Al thin film having lower grain density and a bigger grain size, and the upper film of the at least two films has a second Al thin film having a relatively higher grain density and smaller grain size than the first Al thin film.

According to an aspect of the present invention, the first Al thin film has the grain size 10 nm to 1 μm and a space between grains is 1 to 100 nm, while the second Al thin film has the grain size below 100 nm and a space between grains is below 5 nm.

According to an aspect of the present invention, a surface roughness of the first Al thin film is 60 to 70 Å, while a surface roughness of the second Al thin film is 10 to 50 Å.

According to an aspect of the present invention, the first Al thin film is deposited by either a thermal evaporation method or an ion evaporation method, while the second Al thin film is deposited by a deposition method using an ion beam assisted beam method.

BRIEF DESCRIPTION OF THE DRAWINGS

The above and/or other features and advantages of the present invention will become more apparent to and better appreciated by those of ordinary skill in the art by describing in detail embodiments thereof with reference to the accompanying drawings in which:

FIGS. 4A through 5B are photographs illustrating grain densities of an Al film for a cathode electrode of the organic light emitting device according to an aspect of the present invention the present invention.

DETAILED DESCRIPTION OF THE EMBODIMENTS

Embodiments of the present invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 2:
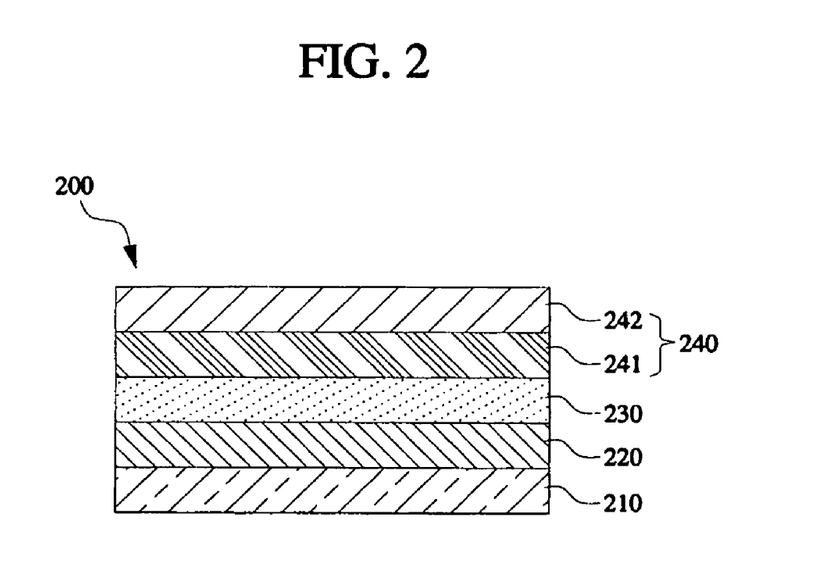
FIG. 2 is a cross-sectional view of an organic light emitting device before encapsulation according to an aspect of the present invention the present invention.

FIG. 2 shows a cross-sectional structure of an organic light emitting device according to an embodiment of the present invention. Referring to FIG. 2, the organic light emitting device 200 according to an embodiment of the present invention has a structure that an anode electrode 220, an organic thin film layer 230, and a cathode electrode 240 are successively formed on an insulating substrate 210. The organic thin film layer 230 includes an organic emitting layer having at least one of a hole-injecting layer, a hole-transporting layer, a hole-blocking layer, an electron-transporting layer, and/or an electron-injecting layer according to aspects of the invention. Further, it is understood that where a position of the cathode electrode 240 and the anode electrode 220 are reversed such that the electrode 240 is an anode and the electrode 220 is a cathode, the order of the layers of organic thin film layer 240 would be reversed according to an aspect of the invention.

The cathode electrode 240 includes a first cathode thin film 241 having a film quality that is not dense. The cathode electrode 240 further includes a second cathode thin film 242 having a film quality that is relatively dense in comparison with the density of the first cathode thin film 241. According to an aspect of the invention, the first cathode thin film 241 is deposited by a thermal evaporation method or an ion beam deposition method to form a first Al thin film that is relatively less dense. According to an aspect of the invention, the second cathode thin film 242 is deposited by an ion beam assisted deposition (hereinafter, referred to as "IBAD") method to form a dense second Al thin film. As shown, the second Al thin film 242 is deposited by the thermal evaporation method or the ion beam deposition method using the assist ion-beam, such as an Ar ion. However, it is understood that other methods could be used to deposit the films 241, 242.

For the first Al thin film 241, a grain size is 10 nm to 1 μm, and a width between grains (i.e., a space between the grains) is 1 nm to 100 nm. For the second Al thin film 242, a grain size is below 100 nm and a space between grains is below 5 nm. However, other densities are usable.

Further, the first Al thin film 241 has 60 to 70 Å root means square (hereinafter, referred to as "RMS") in surface roughness, while the second Al thin film 242 has 10 to 50 Å RMS. Here, the surface roughness is measured by using an analyzer such as an atomic force microscope (AFM). However, other surface roughnesses are usable.

In one embodiment of the present invention, as illustrated in FIG. 2, the cathode electrode 240 has the two-layered Al thin films 241 and 242. Each of the films 241, 242 have a different corresponding grain density. Further there is a boundary surface between the first and second Al thin films 241 and 242 due to a difference of the grain density (i.e., the difference of the grain size). As such, the grain densities have a discontinuous, step function as a function of thickness within the cathode electrode 240 according to an aspect of the invention.

However, where the films 241, 242 are formed to have a gradual change of the grain density, a boundary surface might not be formed between the first and second Al thin films 241 and 242 according to an aspect of the invention. In this aspect, the cathode electrode 240 may be a single Al thin film having a variable grain density as a function of thickness away from the substrate 210 such that a portion of the electrode 240 closest to the substrate 210 has a lesser density and a portion of the electrode 240 farthest from the substrate 210 has a higher density. The gradual change may be a continuous function of the density as a function of distance from the substrate 210, such as a linear change, a curved change, and an "s" shaped curve, or a discontinuous function, such as a stepped change having one or more stepped increases in density according to a distance from the substrate 210.

In an embodiment of the present invention, furthermore, while the cathode electrode 240 has the two-layered Al thin films 241 and 242, the electrode 240 can be formed of multi-layered Al thin films having different grain density. When the cathode electrode 240 is formed with the multi-layered Al thin films, it is preferably, but not required to be, formed in a manner that the higher the layer is located on the electrode 240, the higher the grain density becomes or the smaller the grain size becomes. However, it is understood that the outermost portion of the electrode 240 need not have the highest grain density or smallest grain size according to an aspect of the invention. It is further understood that the portion of the electrode 240 closest to the substrate 210 need not have the least grain density or the largest grain size according to an aspect of the invention.

Figure 4A:
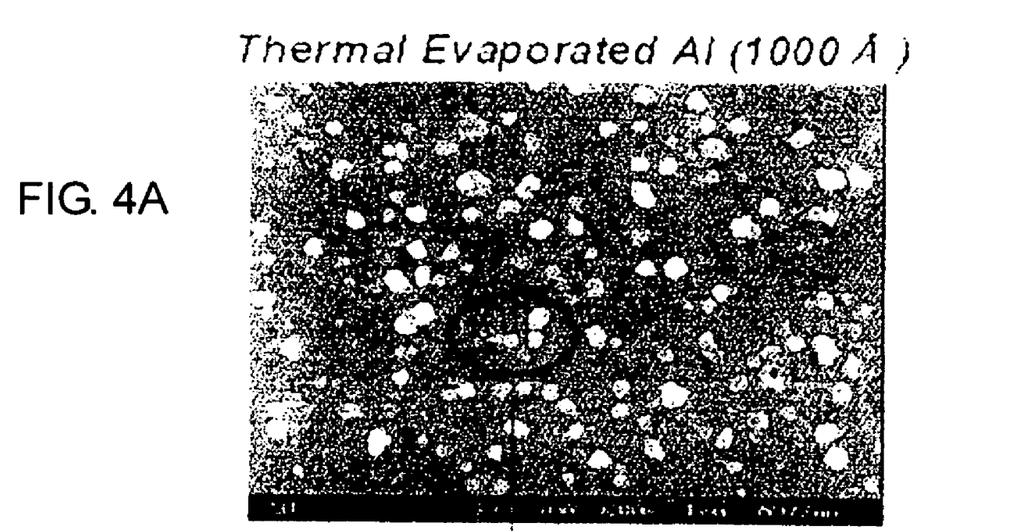
Figure 4B:
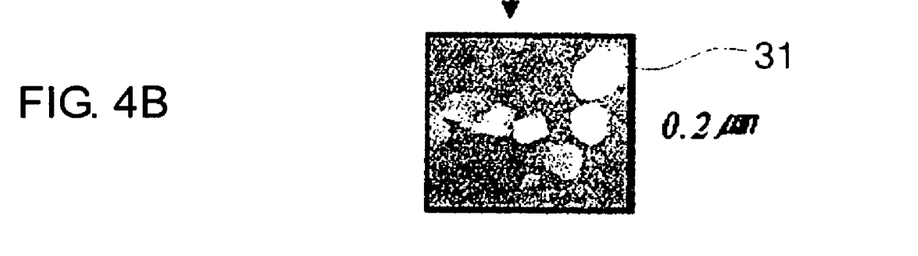
Figure 5A:
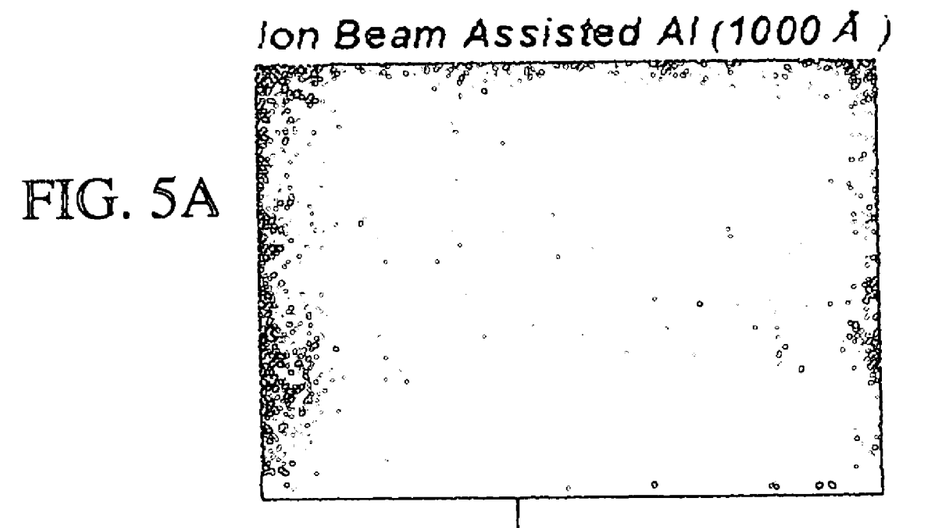
Figure 5B:
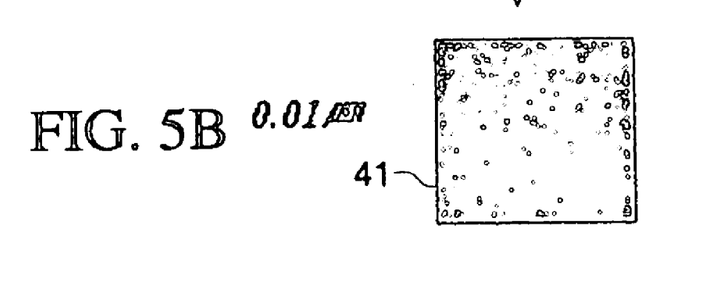

FIGS. 4A through 5B are photographs illustrating the grain density of the cathode electrode 240 for the organic light emitting device according to an embodiment of the present invention. FIGS. 4A and 4B are photographs for the first Al film 241 having the lower grain density of the cathode electrode 240. FIGS. 5A and 5B are photographs for the second Al film 242 having the higher grain density of the cathode electrode 240. In FIGS. 4A through 5B, the first Al thin film 241 is deposited to have a thickness of 1000 Å using the thermal evaporation method. The second Al thin film 242 is deposited to a thickness of 1000 Å by using the IBAD (ion beam assisted deposition) method. It will be recognized that a size of a grain 31 of the first AL think film 241 is 0.2 µm, and a size of a grain 41 of the second Al thin film 242 is 0.01 µm. Therefore, it will be recognized that the second Al thin film 242 deposited by the IBAD method is formed more densely than the first Al thin film 241 deposited by the thermal evaporation method. However, it is understood that other techniques can be used to achieve the Al thin films 241, 242.

Figure 3:
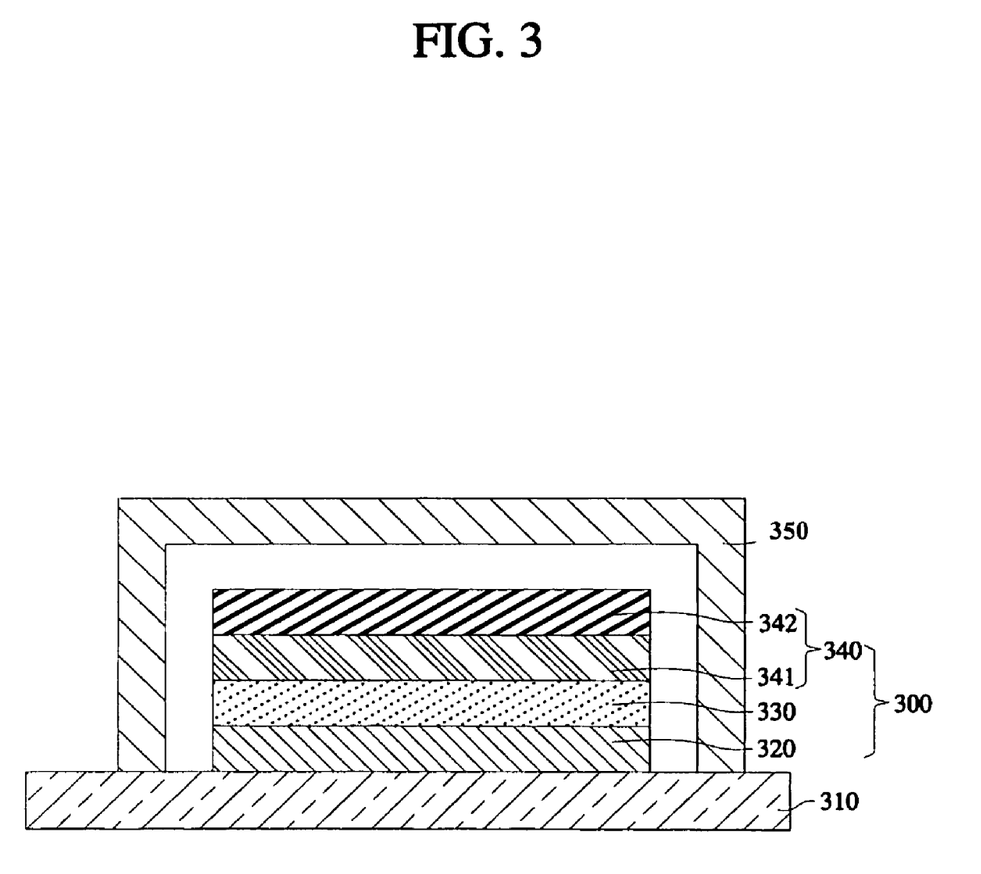
FIGS. 3 is a cross-sectional views of the organic light emitting device after encapsulation according to an aspect of the present invention the present invention.

A method of fabricating the organic light emitting device according to an embodiment of the present invention having the aforementioned structure will be described as follows, with reference to FIG. 3. An anode electrode 320 is formed on a glass substrate 310 that is a transparent insulating substrate. An organic thin film layer 330 is formed on the anode electrode 320. The organic thin film layer 330 includes an emitting layer having at least one of a hole-injecting layer, a hole-transporting layer, a hole-blocking layer, an electron-transporting layer and an electron-injecting layer, although not shown specifically in FIG. 3. Further, it is understood that where a position of the cathode electrode 340 and the anode electrode 320 are reversed such that the electrode 340 is an anode and the electrode 320 is a cathode, the order of the layers of organic thin film layer 340 would be reversed according to an aspect of the invention.

Subsequently, a first Al thin film 341 having a large grain size and low grain density is deposited on the organic thin film layer 330 using the typical thermal evaporation method or the ion beam deposition method. A second Al thin film 342 having a small grain size and high grain density is deposited on the first Al thin film 341 using the IBAD method.

Generally, the IBAD method adds an Ar+ ion as an assist ion in depositing Al from an Al source (not shown) on a substrate to make the Al film more densely deposited by the Ar+ ion. Therefore, the space between grains of the second Al thin film 342 deposited by the IBAD method is reduced, so that the porous property at a grain boundary is also reduced. The IBAD method uses an ion gun of a Kaffman method, an Endhall method or an APS (Advanced Plasma Source) method as an ion source according to aspects of the invention.

The first Al film 241 for the cathode electrode 240 is deposited under a pressure of $10^5$ to $10^7$ torr, and the second Al film 242 is deposited under a pressure of below $10^5$ torr. However, it is understood that other pressures could be used according to aspects of the invention.

In the embodiments of the present invention, the first Al film 341 and the second Al film 342 can be deposited either successively in the same chamber in-situ or non-successively.

After fabricating an organic light emitting element 300, the organic light emitting device 300 is encapsulated with an encapsulating substrate 350 by using a sealant in order to prevent external scratches. Here, a getter that can absorb moisture and oxygen can be attached to the encapsulating substrate 350 according to an aspect of the invention.

According to the embodiment of the present invention described above, the Al film is deposited using an assist beam to have a dense structure, so that the cathode electrode can prevent moisture or oxygen from infiltrating, thereby improving the passivation property and extending the life span of the device. Moreover, since the conventional inorganic encapsulating layer that acts as the passivation can be excluded, an expensive CVD apparatus or a sputtering apparatus is not needed, thereby advantageously reducing the manufacturing cost.

While described in terms of an Al-film, it is understood that other conductive materials could be used with or instead of the Al to form the cathode electrode 240.

Although the embodiments of the present invention have been disclosed for illustrative purposes, those skilled in the art will appreciate that various modifications, additions and substitutions are possible, without departing from the scope and spirit of the invention as disclosed in the accompanying claims and equivalents thereof.

What is claimed is:

1. An organic light emitting device comprising;
   a substrate;
   a lower electrode on the substrate;
   at least one organic thin film layer disposed on the lower electrode; and
   an upper electrode disposed on the at least one organic thin film layer comprising a conductive material, the upper electrode including at least a first thin film having a first grain density of the conductive material and a second thin film having a second grain density of the conductive material other than the first grain density,
   wherein the first and second thin films of the upper electrode have the same conductive material and the second thin film has a grain size at or below 100 nm.

2. The device of claim 1, wherein one of the first and second thin films having a highest one of the first and second grain densities is formed farthest away from the substrate, and the one thin film having the highest grain density acts as a passivation layer that prevents moisture and/or oxygen from infiltrating past the one thin film to the at least one organic thin film layer.

3. The device of claim 2, wherein the first and second thin films form a boundary surface therebetween due to a difference in the first and second grain densities.

4. The device of claim 1, wherein the first grain density has a lower grain density than the second grain density, and the first and second thin films are successively formed on the organic thin film layer.

5. The device of claim 1, wherein the first and second thin films comprise aluminum thin films.

6. An organic light emitting device comprising;
   a substrate;
   a lower electrode disposed on the substrate;
   at least one organic thin film layer disposed on the lower electrode; and
   an upper electrode disposed on the at least one organic thin film, the upper electrode comprising at least a first thin film having a conductive material having a first grain size and a second thin film having the conductive material having a second grain size other than the first grain size,
   wherein the at least first and second thin films have the same conductive material and the second thin film has a grain size at or below 100 nm.

7. The device of claim 6, wherein one of the first and second thin films having a smaller one of the grain sizes is formed as the thin film farthest from the substrate, and the one thin film having the one smaller grain size acts as a passivation layer that prevents moisture and/or oxygen from infiltrating.

8. The device of claim 6, wherein the first and second thin films form a boundary surface therebetween due to a difference of the first and second grain sizes.

9. The device of claim 6, wherein the first thin film has a larger grain size than the grain size of the second thin film, and the first and second films are successively formed on the organic thin film layer.

10. The device of claim 9, wherein the first thin film has a grain size at or between 10 nm to 1 pm and a space between adjacent grains is at or between 1 nm and 100 nm, and a space between adjacent grains is at or below 5 nm.

11. The device of claim 9, wherein the first thin film has a surface roughness of at or between 60 and 70 Å, and the second thin film has a surface roughness of at or between 10 and 50 Å.

12. The device of claim 9, wherein the first thin film and the second thin film comprise aluminum thin films.

13. A method of making an organic light emitting device, the method comprising:
   forming an anode on a transparent insulating substrate;
   forming an organic thin film layer on the anode;
   forming a first thin film having a first grain density on the organic thin film layer; and
   forming a second thin film having a second grain density on the first thin film,
   wherein the first grain density is at or below 100 nm and lower than the second grain density, and the first and second thin films form a cathode of the light emitting device.

14. An organic light emitting device formed by the method of claim 13.

* * * * *

UNITED STATES PATENT AND TRADEMARK OFFICE
CERTIFICATE OF CORRECTION

PATENT NO. : 7,388,223 B2
APPLICATION NO. : 11/365498
DATED : June 17, 2008
INVENTOR(S) : Jin-Woo Park et al.

It is certified that error appears in the above-identified patent and that said Letters Patent is hereby corrected as shown below:

Column 7, line 6, change "1 pm" to --1 μm--.

Column 7, line 10, change "70 A" to --70 Å--.

Signed and Sealed this

Twenty-sixth Day of August, 2008

JON W. DUDAS
*Director of the United States Patent and Trademark Office*